United States Patent [19]
Messina et al.

[11] Patent Number: 6,049,456
[45] Date of Patent: Apr. 11, 2000

[54] ELECTRONIC MODULE ADJUSTMENT DESIGN AND PROCESS USING SHIMS

[75] Inventors: Gaetano P. Messina, Hopewell Junction; Armando S. Cammarano, Hyde Park; Patrick A. Coico, Fishkill; Ronald L. Hering, Pleasant Valley; Eric B. Hultmark, Wappingers Falls; Raed A. Sherif, Croton-On-Hudson, all of N.Y.

[73] Assignee: International Business Machines Corporation, Armonk, N.Y.

[21] Appl. No.: 09/152,904

[22] Filed: Sep. 14, 1998

[51] Int. Cl.[7] ........................................ H05K 7/20
[52] U.S. Cl. .......................... 361/704; 361/715; 257/713; 257/719
[58] Field of Search .................................. 165/80.2, 80.3, 165/80.4, 185; 174/16.3; 257/706–707, 712–713, 717–719, 727; 361/704, 705, 697, 707–710, 714–718, 722

[56] References Cited

U.S. PATENT DOCUMENTS

| | | |
|---|---|---|
| 5,126,827 | 6/1992 | Frank . |
| 5,233,500 | 8/1993 | Liang et al. .............................. 257/727 |
| 5,239,200 | 8/1993 | Messina et al. . |
| 5,311,400 | 5/1994 | Fuchs et al. . |
| 5,315,153 | 5/1994 | Nagai et al. . |
| 5,329,160 | 7/1994 | Miura et al. . |
| 5,517,753 | 5/1996 | Messina . |
| 5,583,746 | 12/1996 | Wang ...................................... 361/697 |
| 5,719,443 | 2/1998 | Messina . |

*Primary Examiner*—Gregory Thompson
*Attorney, Agent, or Firm*—DeLio & Peterson, LLC; Shirley S. Ma; Aziz M. Ahsan

[57] ABSTRACT

A thermal conduction module for cooling one or more integrated circuit chips mounted on a substrate is described. At least one shim is disposed between the base plate and the cover plate of the module to establish a predetermined dimension between the cover plate and the integrated circuit chips mounted on the substrate for insertion of a thermal paste. The shims may be metal, engineered plastic, or thermally and electrically conductive or nonconductive creep resistant materials able to withstand the stress and load within the module over time. The shim may be a plurality of shims having the same thickness or a plurality of shims having a multiplicity of thicknesses. Most preferably, the shim conforms to the periphery of the cover plate or base plate. A method of determining the proper shim thickness is also described wherein an initial reading of the thickness of the cover plate and base plate of the module is obtained. A second reading of the thickness of the module is obtained after the substrate, mounted with at least one integrated circuit chip, is placed onto the base plate followed by a temporary spacer and the cover plate. One or more shims are selected which are equal to the difference between the initial reading and the second reading. The cover plate is removed and the spacer is replaced with the appropriate shim. The cover plate is then fastened to the base plate. Also described is a kit for fixing the thermal paste gap dimension in electronic modules comprising a base plate, cover plate, and a plurality of shims having a multiplicity of thicknesses.

45 Claims, 4 Drawing Sheets

ELECTRONIC MODULE ADJUSTMENT DESIGN AND PROCESS USING SHIMS

BACKGROUND OF THE INVENTION

1. Field of the Invention

This invention relates to electronic modules which use a thermal paste as the cooling element having improved thermal performance by reducing thermal paste gap tolerances, and to a method for determining and fixing the appropriate thermal paste gap specification for a particular module. In particular, this invention relates to an electronic module utilizing shims to fix the thermal paste gap specification and a method of determining the necessary shim size to be used.

2. Description of Related Art

Integrated circuit chips mounted on substrates and particularly in an array on the substrate present special cooling difficulties. While chip size has increased over the years and power usage is more efficient than in the past, new cooling systems are still needed to remove the relatively high power density generated by the chip. The prior art is replete with different types of thermal conduction modules (TCMs) designed to enclose and cool integrated circuit chips on ceramic glass substrates. In some instances, the TCMs utilize liquid coolants to cool the chips, such as those described in U.S. Pat. Nos. 5,239,200; 5,294,830; and 5,177,667 issued to the assignee of this application. Another approach to cooling has been described in U.S. Pat. No. 4,500,945 also assigned to the assignee of this application by the use of pistons contacting the chips within the TCMs to remove heat.

A further approach in cooling chips in TCMs has been to utilize a thermally conductive medium, such as high thermal conductivity paste, between the top of the integrated circuit chips mounted on the substrate and the lower surface of the cover plate facing the substrate. An example of the useful, stable, high solid content, high thermal conductivity paste is disclosed in U.S. Pat. No. 5,098,609. The compound can be applied as a thin film between the top of the chip and the lower surface of the cover of the TCM. In order to properly control the amount of heat removed from the integrated circuit chip, it is desirable to determine a gap of a specified and desired fixed distance between the top of the chip and lower surface of the cover, and fill that space completely with a thermally conductive medium such as the aforementioned paste.

In modules using thermal pastes, the tolerances that directly affect the paste gap dimension, or distance separating the device from the cooling hardware, must be held below acceptable levels, which are typically quite small, or provide a scheme for adjusting out the tolerances in the design of the hardware. Due to the magnitude of typical tolerances on parameters such as chip thickness, substrate thickness, flatness, machined features, etc., the resultant effect on the paste gap would be unacceptably large without adjustment. Therefore, a method of determining and fixing the paste gap within a much tighter tolerance band increases the thermal performance of the module.

Prior art methods of adjusting the proper paste gap between the top surface of the chip and the lower surface of the cover have utilized an integral space within the thermal conduction module to establish the required thermal gap. This spacer is normally integral with the cover plate and extends around the periphery of the area of the substrate on which the integrated surface chips are mounted.

Glass ceramics which are normally used as substrate materials for the integrated circuit chips are brittle and easy to break and must be handled with care. The substrates are normally mounted in the base plate of the TCM which encompasses the edges of the substrate. The cover plate is normally secured to the base plates surrounding the substrate following assembly of the TCM. It has been found that the use of the integral spacer in the TCM can contribute to breakage of the glass ceramic substrates when the cover plate is fastened too tightly to the base plate. This has been found to occur because the integral spacer transfers force directly to the substrate when the fasteners, typically assembly screws or bolts around the periphery of the cover plate, are tightened down to the base plate. The substrate, which is contained within the base plate by a lip extending within its periphery, is then subject to excessive and uneven forces from the spacer which may not be in direct line with the lip of the base plate. The application of excessive force by the fasteners tend to break the substrates near the lip of the base plate. Because parallelism of the lower surface of the cover plate and the top of the integrated circuit chips must be maintained in all assembled parts, an evenly distributed force must be applied around the periphery of the TCM.

A prior art method used by applicant to adjust and fix the paste gap dimension is the use of a set of 22 adjustable set screws to fasten the cover plate to the base plate. However, it has been found that set screw torque properties may present variables resulting in rejected lots and adjustment uncertainty.

Bearing in mind the problems and deficiencies of the prior art, it is therefore an object of the present invention to provide a thermal conduction module having improved thermal and mechanical stability and performance.

A further object of the invention is to provide a thermal conduction module having improved thermal performance which may be assembled with a controlled gap between the lower surface of the cover plate and the upper surface of the integrated circuit chip without causing excessive force and breakage to the chip substrate, whereby a desired thermally conductive medium may be applied between the chip and the cover plate to effect controlled heat removal and cooling of the chip.

A further object of the invention is to provide a method of assembling a thermal conduction module having improved thermal performance.

It is yet another object of the present invention to provide a process for determining the dimension of the thermal paste gap for a particular thermal conduction module.

It is yet another object of the present invention to provide an apparatus for use in fixing the thermal paste gap dimension within a thermal conduction module.

It is yet another object of the present invention to provide a method of making the apparatus used in fixing the thermal paste gap dimension within the thermal conduction module.

It is yet another object of the present invention to provide a kit for fixing the thermal paste gap dimension in electronic modules utilizing thermal pastes as the cooling method.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a thermal conduction module for cooling one or more integrated circuit chips mounted on a substrate. The module comprises a base plate having a periphery, a cover plate having a periphery and a surface facing the substrate, the cover plate being securable to the base plate. At least one shim is disposed between the base plate and the cover plate along the periphery of the base plate and cover plate. The shims establish a predetermined dimension between the cover plate and the integrated circuit chips mounted on the substrate for insertion of a thermally conductive medium. The shim may be a plurality of shims having the same thickness or a plurality of shims having a multiplicity of different thicknesses. Most preferably, the shim has a periphery substantially conforming to the periphery of the cover plate or conforming to the periphery of the base plate. The dimension between the surface of the integrated circuit chip and the cover plate surface facing the substrate is equal to the thickness of a thermally conductive medium such as a thermal paste. A spacer may be temporarily inserted between the cover plate and the chip substrate where the predetermined dimension of the shim corresponds to the thickness of the spacer. A sealing ring is disposed between the cover plate and the base plate and positioned between the shim and the integrated circuit chips. Fasteners, such as assembly set screws, may be used to secure the base plate to the cover plate wherein the shims have apertures corresponding to the fasteners.

In another aspect, the present invention relates to an improved thermal conduction module having a base plate for holding a substrate containing a plurality of integrated circuit chips, a cover plate having a periphery and a surface facing the chip substrate. The improvement comprises a plurality of shims disposed between the base plate and the cover plate along the periphery of the base plate and cover plate. The shims establish a predetermined dimension between the surface of the cover plate facing the substrate and the integrated circuit chips for injection of a thermally conductive medium.

In a further aspect, the present invention relates to an apparatus for reducing thermal paste gap tolerances in thermal conduction modules comprising a base plate containing one or more integrated circuit chips mounted in a substrate within the base plate; a cover plate having a periphery for cooling one or more integrated circuit chips, the cover plate having a surface facing the substrate in integrated circuit chips; a sealing ring disposed between the cover plate and the base plate; a plurality of shims positioned between the periphery of the base plate and the cover plate; and fasteners for securing the cover plate to the base plate. The shims establish a fixed dimension from the cover plate and the base plate so a thermal paste may be inserted between the chip surface and the cover plate surface facing the chip.

In yet another aspect, the present invention relates to a method of assembling a thermal conduction module having a base plate for holding at least one integrated circuit chip mounted on a substrate, a cover plate having a surface facing the substrate, and at least one shim having a predetermined thickness fixing the dimension between the cover plate and the base plate. The method comprises the steps of placing a substrate on the base plate, and optionally mounting at least one integrated circuit chip on the substrate. At least one shim is placed on the base plate. The cover plate is placed over the chip, if present, the substrate, and the base plate then fastened to the base plate. A desired gap is established by the shims between the cover plate and the base plate for injection of a thermally conductive medium between the upper surface of an integrated circuit chip and the cover plate surface facing the chip substrate. The method may further include the step of determining the dimension of the desired gap between the cover plate and the base plate, and using the dimension of the desired gap to determine the thickness of the shims required.

In still another aspect, the present invention relates to a method of determining the proper shim thickness when assembling a thermal conduction module utilizing a thermal paste as a cooling method. The method comprises the steps of taking an initial reading of the combined thickness of the base plate and the cover plate. The cover plate is removed thereafter and a substrate, mounted with at least one integrated circuit chip, is placed onto the base plate. A spacer is placed on top of the substrate followed by replacement of the cover plate on top of the spacer. The thickness of the module is remeasured to obtain a second reading. The proper shim thickness is based on the difference between the initial reading and the second reading. The thickness of the spacer corresponds to the desired thickness of the thermal paste. An additional step is to fix the dimension between the substrate and the cover plate surface facing the substrate by removing and replacing the spacer with at least one shim of desired thickness equal to the thickness of the spacer.

In yet another aspect, the present invention relates to a method of assembling a thermal conduction module having a base plate for holding at least one integrated circuit chip mounted on a substrate, a cover plate having a surface facing the substrate, and at least one shim. An initial reading is taken of the combined thickness of the base plate and the cover plate. The cover plate is removed and a substrate is placed onto the base plate. Optionally, at least one integrated circuit chip is placed onto the substrate. A spacer is placed on top of the substrate and the cover plate replaced on top of the spacer. A second reading is taken of the thickness of the module. One or more shims are selected which are equal to the difference between the initial reading and the second reading. The cover plate is removed and the spacer is replaced with the appropriate shim. The cover plate is then fastened to the base plate.

In yet another aspect, the present invention relates to a method of making a shim for use in thermal conduction modules. The method comprises the steps of creating a pattern corresponding to the apertures and configuration of the base plate or the cover plate on a sheet of material having a predetermined thickness. The sheet of material may be masked with a photoresist layer and its pattern exposed on the sheet. The excess material is removed to form a shim having the corresponding apertures and configuration of the base plate or the cover plate. Preferably, the excess material may be removed by laser etching, or acid etching. Another alternative is to pattern a die set with the corresponding configuration and apertures of the base plate or cover plate whereby the excess material is removed by stamping the sheet with the die set. In a preferred embodiment, the pattern of the shim corresponds to the configuration of the base plate. In another preferred embodiment, the pattern of the shim corresponds to the configuration of the cover plate.

In still yet another aspect, the present invention relates to a shim for thermal conduction modules utilizing a thermal paste as a cooling method having a base plate for holding a chip substrate mounted with one or more integrated circuit chips, a cover plate having a surface facing the chip substrate, the cover plate and base plate forming a cavity for the substrate, and fasteners securing the cover plate to the base plate. A shim may be made from one or more sheets of material having a predetermined thickness conforming to the configuration of the cover plate or base plate with apertures corresponding to the fasteners which secure the base plate to the cover plate, and a center aperture corresponding to the cavity formed by the cover plate and base plate for the substrate.

In yet another aspect, the present invention relates to a kit for fixing the thermal paste gap dimension in electronic modules having a base plate for holding a chip substrate mounted with at least one or more integrated circuit chips, a cover plate having a surface facing the chip substrate, the cover plate and base plate forming a cavity for the substrate, and fasteners securing the cover plate to the base plate. The kit comprises a plurality of shims having a multiplicity of thickness, each shim having a constant thickness and conforming to the configuration of the cover plate or the base plate. The shims have apertures corresponding to the fasteners which secure the cover plate to the base plate, and a center aperture corresponding to the cavity formed by the cover plate and base plate for the substrate. The shims are adapted to be stacked between the cover plate and base plate achieving a measured thickness that results in establishing the required thermal paste gap between the cover plate and the integrated circuit chips. Preferably, the kit further includes a spacer having a thickness used in determining the thickness of the shims needed in establishing the required thermal paste gap dimension. Optionally, the kit may also contain the base plate and cover plate wherein the shims are stacked between the cover plate and the base plate.

In the preceding embodiments, the shim may be metal, most preferably, a metal selected from the group consisting of aluminum, copper and stainless steel, or a creep resistant material. An example of a creep resistant material may be liquid crystal polymers or other engineered plastics able to withstand the stress and load within the module. The shim may be electrically and thermally conductive or non-conductive.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
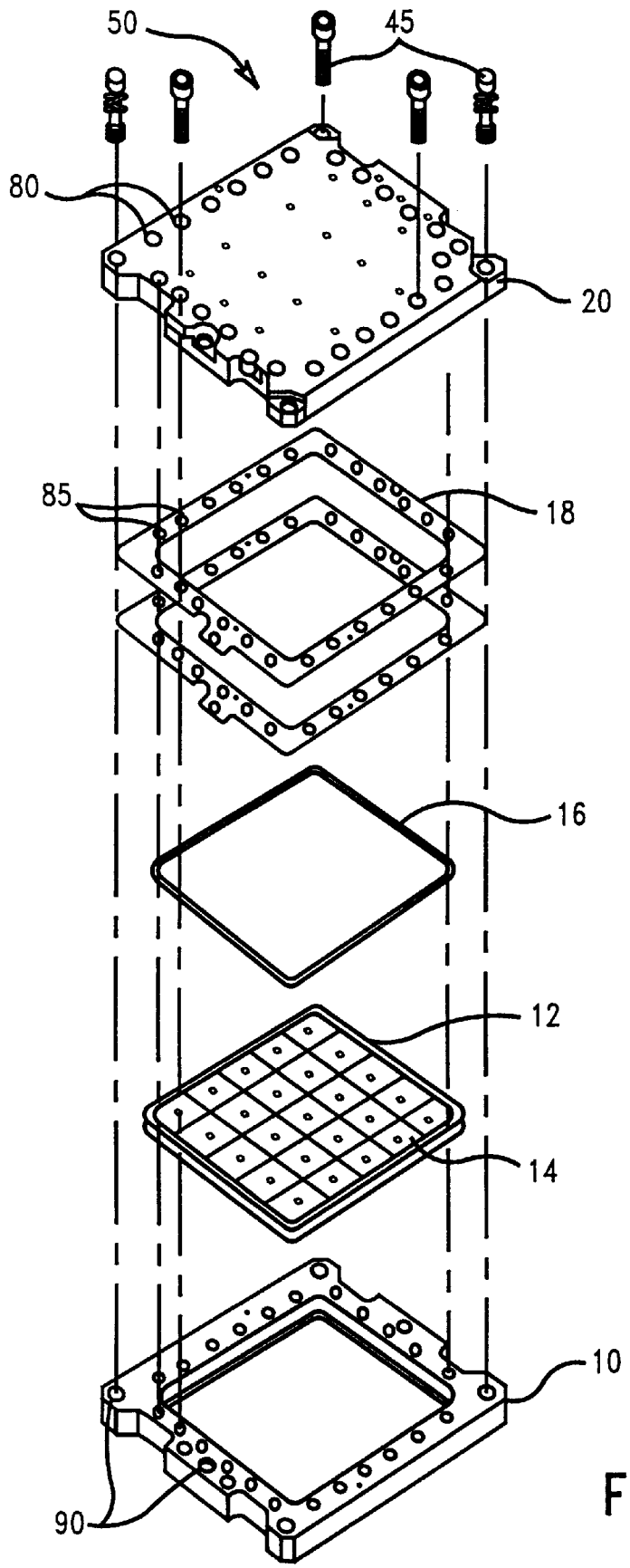
FIG. 1 is an exploded perspective view of the preferred thermal conduction module of the present invention.

In describing the preferred embodiment of the present invention, reference will be made herein to FIGS. 1–4 of the drawings in which like numerals refer to like features of the invention. Features of the invention are not necessarily shown to scale in the drawings.

Figure 2:
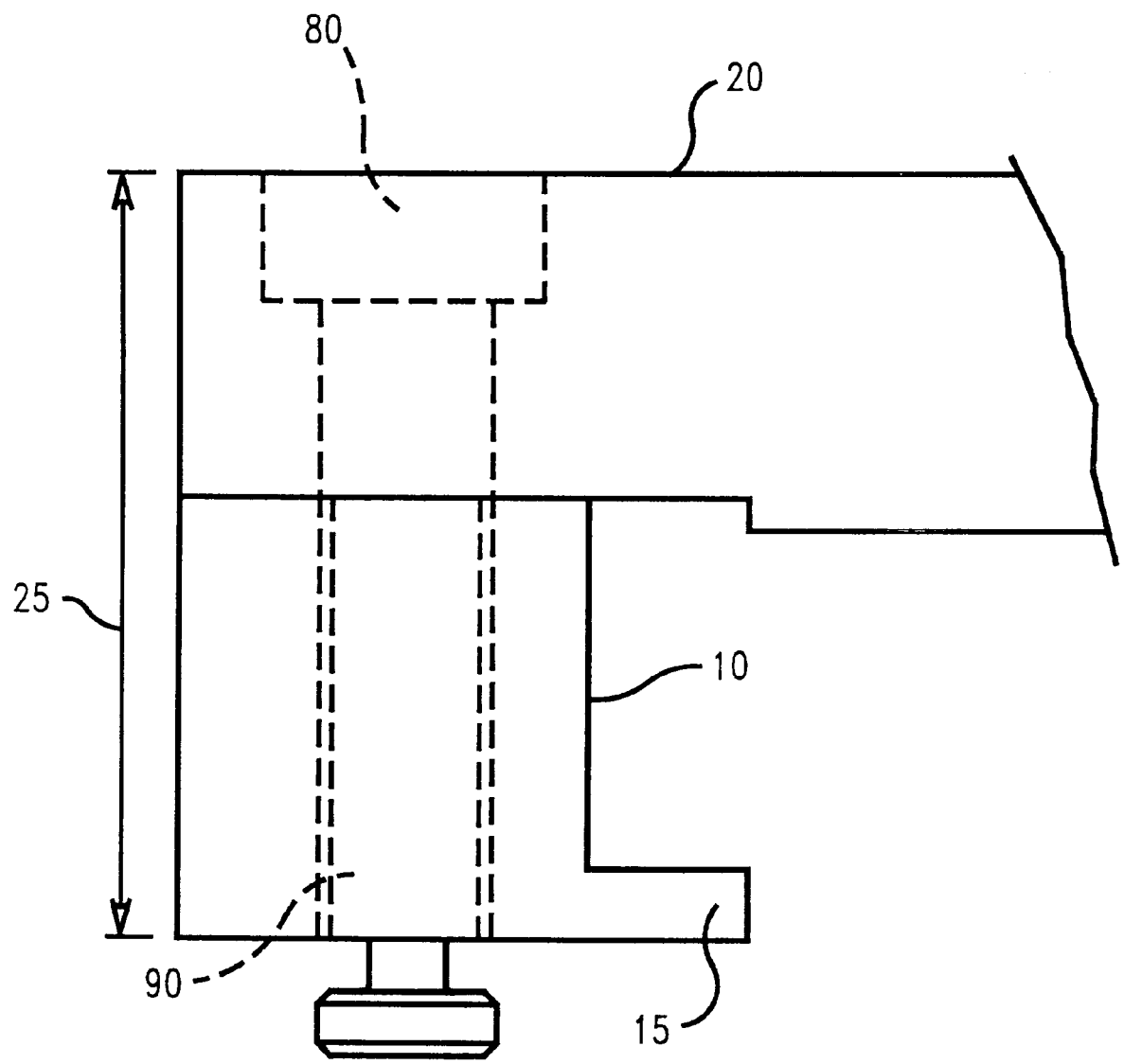
FIG. 2 is a side elevational view of a portion of the cover plate and base plate of the thermal conduction module of FIG. 1, prior to final assembly, where the thickness of the two plates is initially measured when determining the shim thickness.
Figure 4:
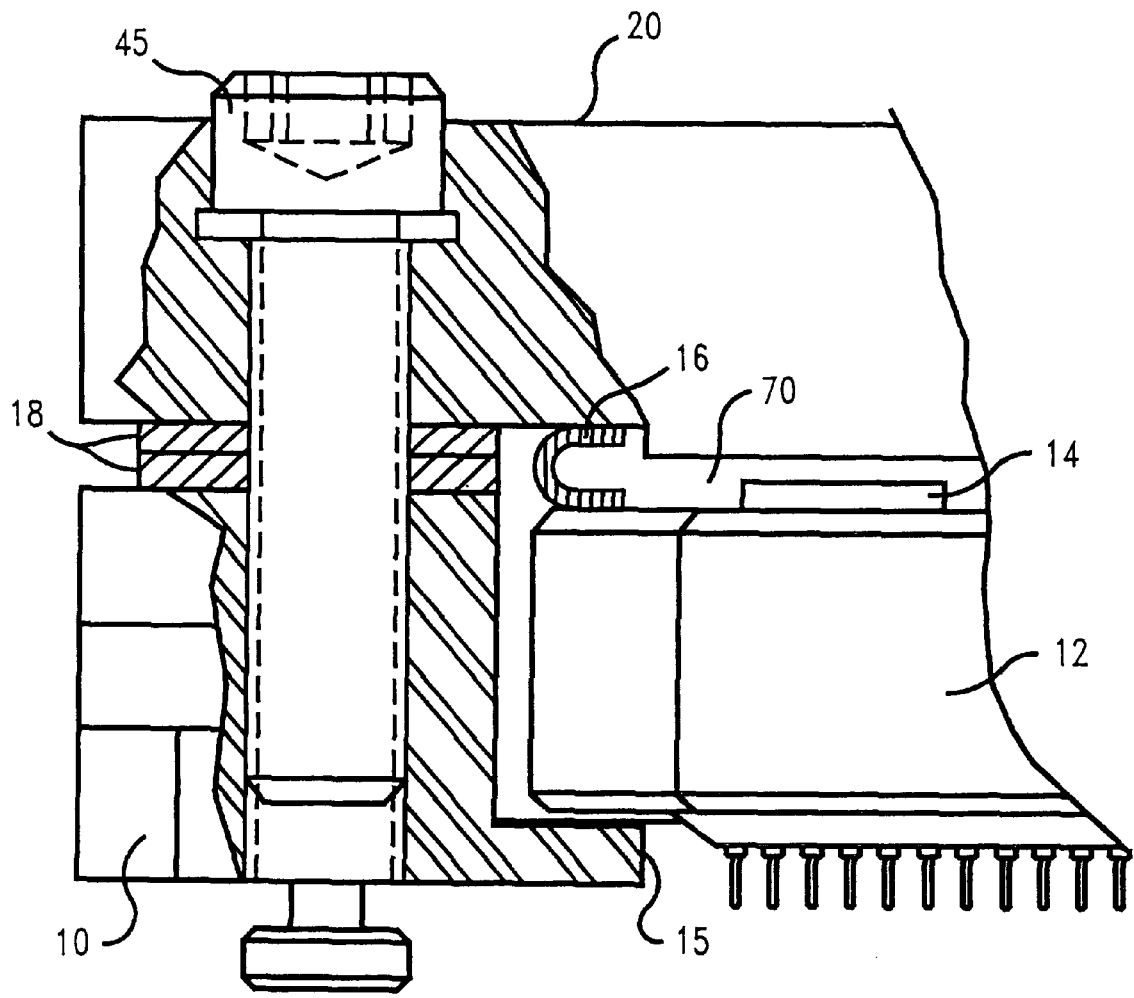
FIG. 4 is an elevational view, partially in cross-section, of a portion of the thermal conduction module of FIG. 1 after adjustment and assembly.

In FIG. 1, there is shown a preferred embodiment of the invention which comprises a thermal conduction module 50. The module comprises cover plate 20 having a number of apertures 80, securable to base plate 10, having apertures 90 corresponding to those in the cover plate 20, for holding a chip substrate 12. The base plate 10 has a lip 15 (as shown in FIG. 2) extending within its periphery upon which sits substrate 12. When the cover plate 20 is fastened to the base plate 10, a cavity 70 (as shown in FIG. 4) is formed wherein the substrate 12 is contained. The substrate 12 holds on its surface a plurality of integrated circuit chips 14 typically arranged in an array, such as a 5×5 array. The chips 14 are electrically connected to the substrate by any known method in the art. The lower surface of the substrate 12 may contain connectors (not shown) for connection of the module to a circuit board within a computer or other electronic device.

A sealing ring 16 is disposed on the periphery of the substrate 12 to create a hermetic seal between substrate 12 and the surface of cover plate 20 facing substrate 12. When assembled, the height of the sealing ring 16 is compressed within cavity 70 by securing cover plate 20 to base plate 10.

At least one reusable shim 18 is disposed between the base plate 10 and cover plate 20. The shims 18 have apertures 85 corresponding to the apertures on cover plate 20 and base plate 10 in order to fasten cover plate 20 to base plate 10 through shims 18. The shims may be made of any standard or non-standard thicknesses, for example: 0.025, 0.05, 0.075, 0.125, 0.200, 0.300, and/or 0.50 mm. Combinations of these shims are picked as needed. In effect, shims 18 lifts cover plate 20 away from chips 14 in the proper amount required equal to the nominal paste gap dimension within a much tighter tolerance band.

The shims can be made by conforming a sheet of material having a desired thickness to either the configuration of the periphery of cover plate 20 or base plate 10. The sheet is then masked with a photoresist layer and the necessary pattern exposed. Acid or laser etching of the sheet gives the desired shim shape along with apertures corresponding to fasteners 85 and a center aperture for cavity 70. Stamping the sheet with a die set patterned with the desired shape and apertures is also preferable. The shims 18 may be made from aluminum, copper, stainless steel, other metal sheets, or any creep resistant material of the desired thickness. The material may be thermally or electrically conductive or nonconductive.

Figure 3:
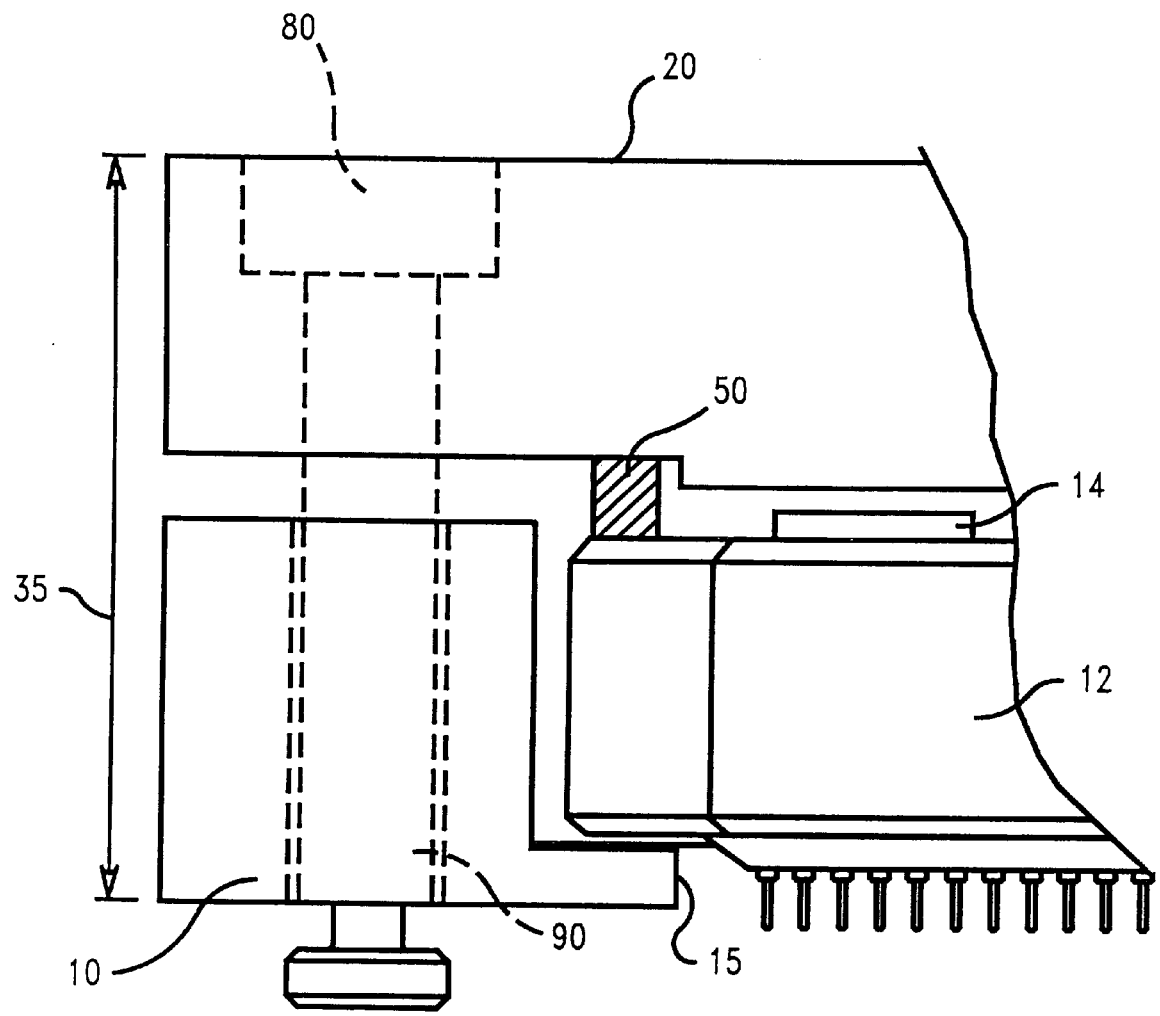
FIG. 3 is a side elevational view of a portion of the thermal conduction module of FIG. 1 having a spacer used in determining shim thickness.

In determining the proper shim size when assembling a TCM utilizing a thermal paste as a cooling method, an initial reading 25 of the combined thickness of cover plate 20 and base plate 10, as shown in FIG. 2, is obtained. Next, cover plate 20 is removed and substrate 12 is positioned on base plate 10. In FIG. 3, a spacer 30 of the appropriate thickness corresponding to the substrate design is placed on substrate 12. The spacer 30, by design, provides the key dimension that determines the paste gap. Cover plate 20 is replaced on top of the components, actually resting on spacer 30. A second thickness reading 35 is taken. The difference between initial reading 25 and second reading 35 is the required shim thickness for the module. One or more shims needed to arrive at that value are selected and module 50 is readied for final assembly. The shims are reusable helping to keep overall program costs low. The thermal paste may be inserted prior to final assembly or after assembly is completed.

In FIG. 4, there is shown a partial side view of the most preferred embodiment of the invention after adjusting and fixing the thermal paste gap dimension, and assembling the module. As shown, base plate 10 has a lip extending from within its periphery to support substrate 12. The cover plate 20 may be secured to base plate 10 by means of any known fastener 45 in the art. The shims 18 are disposed along the periphery of cover plate 20 and base plate 10 creating a fixed gap for insertion of the thermal paste between the cover plate surface facing substrate 12 and the top surface of chip 14. The shims 18 are held in place by the extension of fasteners 45 through corresponding apertures in cover plate 20, base plate 10, and shims 18. Upon final assembly, sealing ring 16 is compressed to provide a hermetically sealed space between the periphery of substrate 12 and cover plate 20 enclosing the chips within cavity 70.

The above invention achieves the objects recited above. The present invention has improved thermal performance over the prior art because the shims set an optimal thermal paste gap dimension within much tighter tolerances over the prior art without having to take into account other tolerances associated with remaining module components. The mechanical stability and rigidity of the shimmed assembly yields improved thermal stability of the thermal paste cooling scheme.

The thermal conduction modules of the prior art could not be tightened with high torque without breakage of the substrate due to yielding of the set screws used in adjusting the hardware for purposes of fixing the thermal paste gap. The present invention fixes an optimal thermal paste gap using shims which are disposed between the cover plate and base plate of the module without direct force on the substrate thereby, reducing breakage of the substrate. The force applied when the thermal conduction module is tightened is spread along the periphery of the base plate and cover plate, and directly on the shims.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A thermal conduction module for cooling one or more integrated circuit chips mounted on a substrate, comprising:
   a base plate for holding the chip substrate, said base plate having a periphery;
   a cover plate having a periphery and a surface facing the substrate, said cover plate being securable to said base plate;
   a plurality of shims disposed between said base plate and said cover plate along the periphery of said base plate and said cover plate to fix a predetermined dimension between said cover plate and the chips on the substrate; and
   a thermally conductive medium of a thickness corresponding to the predetermined thickness between said cover plate and the chips on the substrate inserted between said cover plate and the chips on the substrate, whereby said shims establish a predetermined dimension between said cover plate and integrated circuit chips mounted on the substrate for insertion of said thermally conductive medium.

2. A thermal conduction module according to claim 1, wherein said plurality of shims are metal.

3. A thermal conduction module according to claim 2, wherein said metal is selected from the group consisting of aluminum, copper, and stainless steel.

4. A thermal conduction module according to claim 1, wherein said plurality of shims comprise a creep resistant material.

5. A thermal conduction module according to claim 1, wherein said plurality of shims are reusable.

6. A thermal conduction module according to claim 1, wherein each of said plurality of shims has a periphery substantially conforming to the periphery of said cover plate.

7. A thermal conduction module according to claim 1, wherein each of said plurality of shims has a periphery substantially conforming to the periphery of said base plate.

8. A thermal conduction module according to claim 1, further including a spacer having a thickness adapted for temporary insertion between said cover plate and the substrate, wherein the thickness of said spacer corresponds to the predetermined dimension of said plurality of shims.

9. A thermal conduction module according to claim 1, further including a sealing ring disposed between said cover plate and said base plate and positioned between said plurality of shims and the substrate.

10. A thermal conduction module according to claim 1, further including fasteners for securing said base plate to said cover plate, and wherein said plurality of shims have apertures corresponding to said fasteners.

11. An improved thermal conduction module having
    a base plate for holding a substrate containing a plurality of integrated circuit chips, said base plate having a periphery; and
    a cover plate having a periphery and a surface facing the chip substrate;
    wherein the improvement comprises of a plurality of shims disposed between said base plate and said cover plate along the periphery of said base plate and said cover plate establishing a predetermined dimension between surface of cover plate facing the substrate and the integrated circuit chips for injection of a thermally conductive medium.

12. An apparatus for reducing thermal paste gap tolerances in thermal conduction modules, comprising:
    a base plate containing one or more integrated circuit chips mounted in a substrate within said base plate, said base plate having a periphery;
    a cover plate having a periphery for cooling one or more integrated circuit chips, said cover plate having a surface facing the substrate and integrated circuit chips;
    a sealing ring disposed between said cover plate and said base plate;
    a plurality of shims positioned between the periphery of said base plate and said cover plate; and fasteners for securing said cover plate to said base plate,
    whereby said shims establish a fixed dimension from said cover plate and said base plate so a thermal paste may be inserted between the chip surface and said cover plate surface facing the chip.

13. A thermal conduction module for cooling one or more integrated circuit chips mounted on a substrate, comprising:
    a base plate for holding the substrate;
    a cover plate securable to said base plate;
    a plurality of shims of substantially equal thicknesses disposed between said base plate and said cover plate along a periphery of said base plate and a periphery of said cover plate to establish a predetermined dimension between said cover plate and the substrate; and
    a thermally conductive medium inserted between said cover plate and the substrate.

14. A thermal conduction module for cooling one or more integrated circuit chips mounted on a substrate, comprising:

a base plate for holding the substrate;

a cover plate securable to said base plate;

a plurality of shims of varying thicknesses disposed between said base plate and said cover plate along a periphery of said base plate and a periphery of said cover plate to establish a predetermined dimension between said cover plate and the substrate; and a thermally conductive medium inserted between said cover plate and the substrate.

15. A kit for fixing a thermal paste gap dimension in electronic modules comprising:

a base plate for holding a substrate having one or more integrated circuit chips;

a cover plate adapted to forming a cavity for a substrate when said cover plate is secured to said base plate;

fasteners for securing said base plate to said cover plate; and a plurality of shims of varying thicknesses and conforming to the configuration of said cover plate or said base plate, having apertures corresponding to the fasteners for securing said base plate to said cover plate and a center aperture corresponding to the cavity for the substrate.

16. A kit for fixing the thermal paste gap dimension in electronic modules according to claim 15 wherein said plurality of shims are stackable between said cover plate and said base plate.

17. A kit for fixing the thermal paste gap dimension in electronic modules according to claim 15 wherein said plurality of shims are metal.

18. A kit for fixing the thermal paste gap dimension in electronic modules according to claim 15 wherein said plurality of shims comprise a metal selected from the group consisting of aluminum, copper and stainless steel.

19. A kit for fixing the thermal paste gap dimension in electronic modules according to claim 15 wherein said plurality of shims comprise a creep resistant material.

20. A kit for fixing a thermal paste gap dimension in electronic modules comprising:

a base plate for holding a substrate having one or more integrated circuit chips;

a cover plate adapted to forming a cavity for a substrate when said cover plate is secured to said base plate;

fasteners for securing said base plate to said cover plate; and a plurality of shims of equal thicknesses and conforming to the configuration of said cover plate or said base plate, having apertures corresponding to the fasteners for securing said base plate to said cover plate and a center aperture corresponding to the cavity for the substrate.

21. A kit for fixing the thermal paste gap dimension in electronic modules according to claim 20 wherein said plurality of shims are stackable between said cover plate and said base plate.

22. A kit for fixing the thermal paste gap dimension in electronic modules according to claim 20 wherein said plurality of shims are metal.

23. A kit for fixing the thermal paste gap dimension in electronic modules according to claim 20 wherein said plurality of shims comprise a metal selected from the group consisting of aluminum, copper and stainless steel.

24. A kit for fixing the thermal paste gap dimension in electronic modules according to claim 20 wherein said plurality of shims comprise a creep resistant material.

25. A kit for fixing a thermal paste gap dimension in electronic modules comprising:

a base plate for holding a substrate having one or more integrated circuit chips;

a cover plate adapted to forming a cavity for a substrate when said cover plate is secured to said base plate;

fasteners for securing said base plate to said cover plate;

a spacer having a thickness for temporary insertion between said cover plate and said base plate to predetermine the thermal paste gap dimension; and a plurality of shims of varying thicknesses and conforming to the configuration of said cover plate or said base plate, having apertures corresponding to the fasteners for securing said base plate to said cover plate and a center aperture corresponding to the cavity for the substrate.

26. A kit for fixing the thermal paste gap dimension in electronic modules according to claim 25 wherein said plurality of shims are stackable between said cover plate and said base plate.

27. A kit for fixing the thermal paste gap dimension in electronic modules according to claim 25 wherein said plurality of shims are metal.

28. A kit for fixing the thermal paste gap dimension in electronic modules according to claim 25 wherein said plurality of shims comprise a metal selected from the group consisting of aluminum, copper and stainless steel.

29. A kit for fixing the thermal paste gap dimension in electronic modules according to claim 26 wherein said plurality of shims comprise a creep resistant material.

30. A kit for fixing a thermal paste gap dimension in electronic modules comprising:

a base plate for holding a substrate having one or more integrated circuit chips;

a cover plate adapted to forming a cavity for a substrate when said cover plate is secured to said base plate;

fasteners for securing said base plate to said cover plate;

a spacer having a thickness for temporary insertion between said cover plate and said base plate to predetermine the thermal paste gap dimension; and a plurality of shims of equal thicknesses and conforming to the configuration of said cover plate or said base plate, having apertures corresponding to the fasteners for securing said base plate to said cover plate and a center aperture corresponding to the cavity for the substrate.

31. A kit for fixing the thermal paste gap dimension in electronic modules according to claim 30 wherein said plurality of shims are stackable between said cover plate and said base plate.

32. A kit for fixing the thermal paste gap dimension in electronic modules according to claim 30 wherein said plurality of shims are metal.

33. A kit for fixing the thermal paste gap dimension in electronic modules according to claim 30 wherein said plurality of shims comprise a metal selected from the group consisting of aluminum, copper and stainless steel.

34. A kit for fixing the thermal paste gap dimension in electronic modules according to claim 20 wherein said plurality of shims comprise a creep resistant material.

35. A method of assembling a thermal conduction module comprising the steps of:

(a) providing a substrate having one or more integrated circuit chips mounted thereon;

(b) providing a base plate and a cover plate, said substrate disposed between said base plate and said cover plate;

(c) determining an optimal gap dimension between said cover plate and said substrate;

(d) providing a plurality of shims having a thickness substantially equal to said gap dimension; and (e) fixing said gap dimension by inserting said plurality of shims between said cover plate and said base plate.

36. The method of claim 35 further including the step of inserting a thermally conductive medium into said gap dimension for cooling the one or more integrated circuit chips mounted on said substrate.

37. The method of claim 35 wherein step (c) comprises:

(i) measuring a combined thickness of said base plate and said cover plate to obtain an initial reading;

(ii) measuring a combined thickness of said base plate and said cover plate with said substrate and a spacer therebetween to obtain a second reading, said spacer corresponding to a desired thickness of a thermally conductive medium to be inserted into said gap dimension; and (iii) determining said optimal gap dimension from a difference between the second reading and the initial reading.

38. The method of claim 35 wherein step (d) comprises providing a plurality of shims having equal thicknesses.

39. The method of claim 35 wherein step (d) comprises providing a plurality of shims having varying thicknesses.

40. A method of determining the proper shim thickness when assembling a thermal conduction module utilizing a thermal paste as a cooling medium comprising the steps of:

(a) providing a base plate and a cover plate, said cover plate securable to said base plate;

(b) measuring a combined thickness of said base plate and said cover plate to obtain an initial reading;

(c) removing said cover plate to place a substrate having at least one integrated circuit chip onto said base plate;

(d) providing a spacer and placing said spacer between said substrate and said cover plate;

(e) replacing said cover plate over said spacer and said substrate;

(f) measuring a combined thickness of said cover plate, said base plate, said spacer, and said substrate to obtain a second reading; and (g) determining the proper shim thickness based on a difference between the initial reading and the second reading.

41. The method of claim 40 wherein said spacer corresponds to a desired thickness of the thermal paste to be used as the cooling method.

42. The method of claim 40 further including the steps of removing said spacer and fixing the proper shim thickness by replacing said spacer with a plurality of shims having a thickness equal to a thickness of said spacer.

43. A method of assembling a thermal conduction module comprising the steps of:

(a) providing a substrate having one or more integrated circuit chips mounted thereon;

(b) providing a base plate for holding said substrate;

(c) providing a cover plate securable to said base plate;

(d) obtaining a first measurement equal to a combined thickness of said cover plate and said base plate;

(e) providing a spacer corresponding to a thickness of a thermal paste for cooling the chips mounted on said substrate;

(f) placing said substrate over said base plate and placing said spacer over said substrate;

(g) replacing said cover plate over said space;

(h) obtaining a second measurement of a combined thickness of said cover plate, said base plate, said substrate and said spacer;

(i) selecting a plurality of shims equal in thickness to a difference between said second measurement and said first measurement;

(j) replacing said spacer with said plurality of shims; and (k) fastening together said cover plate, said plurality of shims, said substrate and said base plate to form a thermal conduction module.

44. The method of claim 43 further including the step of providing a sealing ring disposed on a periphery of said substrate and said cover plate.

45. The method of claim 43 further including the step of inserting a thermally conductive medium between the integrated circuit chips and said cover plate for cooling the chips.

* * * * *